United States Patent
Bhatt et al.

[19]

[11] Patent Number: 6,162,365
[45] Date of Patent: *Dec. 19, 2000

[54] PD ETCH MASK FOR COPPER CIRCUITIZATION

[75] Inventors: Ashwinkumar C. Bhatt, Endicott; John Gerard Gaudiello, Poughkeepsie, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/034,936

[22] Filed: Mar. 4, 1998

[51] Int. Cl.$^7$ .............................. H01B 13/00; H01K 3/10; G03C 5/00; C25D 5/02; B05D 5/12

[52] U.S. Cl. ................................ 216/13; 216/17; 216/18; 216/19; 216/20; 29/852; 430/314; 430/318; 205/125; 205/126; 427/98; 427/105

[58] Field of Search .................... 216/13, 17–20; 29/852; 430/314, 318; 205/125, 126; 427/98, 405

[56] References Cited

U.S. PATENT DOCUMENTS

| | | | |
|---|---|---|---|
| 3,006,819 | 10/1961 | Wilson et al. | 205/126 |
| 3,013,956 | 12/1961 | Hugle et al. | 216/13 |
| 3,075,866 | 1/1963 | Baker et al. | 216/13 |
| 3,115,423 | 12/1963 | Ashworth | 216/13 |
| 3,152,938 | 10/1964 | Osifchin et al. | 430/315 |
| 3,240,684 | 3/1966 | Martin et al. | 216/13 |
| 3,269,861 | 8/1966 | Schneble, Jr. et al. | 430/314 |
| 3,287,191 | 11/1966 | Borth | 430/318 |
| 3,297,442 | 1/1967 | Spiers | 216/13 |
| 3,483,615 | 12/1969 | Gottfried | 430/314 |
| 3,522,085 | 7/1970 | Watanabe | 430/314 |
| 3,666,549 | 5/1972 | Rhodenizer et al. | 205/126 |
| 3,791,858 | 2/1974 | McPherson et al. | 430/318 |
| 3,991,231 | 11/1976 | Trausch | 430/314 |
| 4,024,631 | 5/1977 | Castillero | 430/314 |
| 4,076,575 | 2/1978 | Chang | 430/314 |
| 4,144,118 | 3/1979 | Stahl | 205/126 |
| 4,211,603 | 7/1980 | Reed | 430/314 |
| 4,224,361 | 9/1980 | Romankiw | 430/314 |
| 4,306,925 | 12/1981 | Lebow et al. | 430/315 |
| 4,316,779 | 2/1982 | Yahalom | 204/29 |
| 4,325,780 | 4/1982 | Schulz, Sr. | 430/318 |
| 4,440,823 | 4/1984 | Hoffmann | 216/13 |
| 4,444,619 | 4/1984 | O'Hara | 29/852 |
| 4,525,390 | 6/1985 | Alpaugh et al. | 427/305 |
| 4,528,064 | 7/1985 | Ohsawa et al. | 29/852 |
| 4,755,265 | 7/1988 | Young | 204/45.1 |
| 4,933,045 | 6/1990 | DiStefano et al. | 29/852 |
| 4,946,563 | 8/1990 | Yeatts | 29/852 |
| 5,017,271 | 5/1991 | Whewell et al. | 204/15 |
| 5,139,823 | 8/1992 | Toba et al. | 430/315 |
| 5,158,860 | 10/1992 | Gulla et al. | 430/315 |
| 5,167,992 | 12/1992 | Lin et al. | 427/437 |
| 5,268,260 | 12/1993 | Bantu et al. | 430/325 |
| 5,309,632 | 5/1994 | Takahashi et al. | 29/852 |
| 5,376,248 | 12/1994 | Conrod et al. | 204/164 |
| 5,415,762 | 5/1995 | Allardyce et al. | 205/166 |
| 5,443,865 | 8/1995 | Tisdale et al. | 427/304 |
| 5,457,881 | 10/1995 | Schmidt | 29/852 |
| 5,526,564 | 6/1996 | Oshima et al. | 29/852 |
| 5,665,525 | 9/1997 | Pienimaa | 430/315 |
| 5,666,722 | 9/1997 | Tamm et al. | 29/852 |
| 5,758,412 | 6/1998 | Knopp | 29/852 |
| 5,761,802 | 6/1998 | Grigas | 29/852 |
| 5,799,393 | 9/1998 | Backasch et al. | 29/852 |
| 5,863,405 | 1/1999 | Miyashita | 29/852 |

*Primary Examiner*—Mark L. Bell
*Assistant Examiner*—Patricia L. Hailey
*Attorney, Agent, or Firm*—William N. Hogg

[57] ABSTRACT

A process for making a printed circuit board is provided. The process employs a noble metal as an etch mask for subtractive circuitization and as a seed layer for secondary finishing. In a preferred embodiment of the invention, a dielectric is covered by a conductive layer of metal such as copper, a patterned photoresist is applied, additional copper is deposited on areas not covered by the photoresist, and a palladium etch mask/seed layer is deposited on the copper. The palladium layer remains sufficiently active for deposition of nickel or gold on the circuitry for purposes such as wire bonding.

23 Claims, 3 Drawing Sheets

PD ETCH MASK FOR COPPER CIRCUITIZATION

BACKGROUND

1. Field of the Invention

This invention relates generally to printed wiring boards that are made in part using the subtractive etch method. More specifically, the invention relates to a method of producing fine-line circuitry and the resulting product wherein a noble metal is used as an etch mask for the subtractive etch process and the noble metal is also a seed layer for surface finishing via additive plating.

2. Description of Related Art

Certain conventional processes of forming printed wiring board (PWB) circuitry employ a metallic tin-lead etch mask when the subtractive etch method is used. A conventional circuitization process which employs either the electrolytic plating or the electroless plating process for circuitization is as follows: A dielectric substrate is covered with a metal foil base for plating initiation. Next, holes are drilled and they are metallized by thinly seeding them, along with the copper foil, with a palladium or other activator that acts as a catalytic surface for electroless copper deposition. The substrate is plated with a thin layer of electroless copper that electrically connects the holes with the base copper foil. Next, a photoresist is deposited on top of the copper clad laminate and is exposed with the desired pattern and developed. The clad laminate with photoresist then undergoes electrolytic or electroless plating of conductive metal onto the exposed metallized surface of the laminate and onto the inside surface of the holes. A metallic tin-lead etch mask is deposited on the circuitry. Thereafter, the photoresist is stripped off, exposing the underlying metallic foil base in the areas surrounding the circuitry. The metal foil base is then etched away where the photoresist was stripped off leaving, for example, copper/tin-lead circuitry on the surface of the board and on the inner surface of the holes at the completion of the circuitization process.

Although the tin-lead layer can be left on the circuitry as a protective layer, the tin-lead mask often must be removed whenever wiring board circuitry requires subsequent surface finishing. An example of surface finishing can include a nickel layer on top of the copper to prevent corrosion and to act as a diffusion barrier between copper and an additional deposited metal. The nickel is also used to promote adhesion of a gold layer when, for example, an application calls for wire bonding between the circuitry and wire bond silicon die.

The tin-lead strip processes currently employed can be too aggressive or incomplete or both. Aggressive tin-lead etching damages the copper circuitry whereas incomplete etching leaves a tin-lead residue which hinders plating of additional metals on the circuitry. As a result, printed wiring boards requiring surface finishing must be constructed using higher cost and lower yield methods such as full build additive plating or pattern electroplating.

Accordingly, the need exists for a method of making printed circuit boards which eliminates the problems associated with removal of the etch mask.

SUMMARY OF THE INVENTION

The present invention provides a method for circuitizing printed wire boards and plating surface finish metallurgy, and the resulting circuit boards. The method employs a noble metal, preferably palladium, as an etch mask. Advantageously, the noble metal also serves as a seed layer for subsequent surface finishing.

In accordance with the method, a printed wiring board is produced by laminating a first electrically-conductive layer such as copper foil, to a substrate. Optionally, holes are formed in the laminate. Next, a seed activator is deposited on the laminate and on the surfaces of the holes. A photoresist layer is then placed on top of the first conductive layer and a pattern is created for circuitry by exposing and developing the photoresist in the desired pattern. The laminate covered by patterned photoresist undergoes plating, preferably electroless plating, of a second conductive metal layer such as copper around the photoresist and including the inner surfaces of the exposed holes. Then, a noble metal, preferably palladium, is deposited preferably by electroless plating onto the metal circuitry and the inner surface of the holes to provide a noble metal etch mask. Next, the photoresist is stripped off, thus revealing the underlying first conductive layer of conductive foil in areas surrounding the circuitry. The exposed area of metal foil not covered by the palladium is etched away. The result is a printed wiring board having a layer of noble metal on the circuitry. Advantageously, the noble metal does not need to be removed for plating of various metals such as nickel, silver or gold on the circuitry since the noble metal, after contact with the etch solution, is able to catalytically activate the metal circuitry for additive metallization. The use of a noble metal as an etch mask/seed layer provides an active surface for both electroless and electrolytic deposition processes. Thus, the present method eliminates the need to remove the etch mask and the problems associated with removal. The present method also eliminates the need to apply a new seed layer for secondary finishing.

The following description and drawings are set forth and detail certain illustrative embodiments of the invention. However, these are but a few of the various ways in which the principles of the invention may be employed.

BRIEF DESCRIPTION OF DRAWINGS

The present invention may be more readily understood by reference to the following drawings wherein.

DETAILED DESCRIPTION OF THE INVENTION

Figure 1:
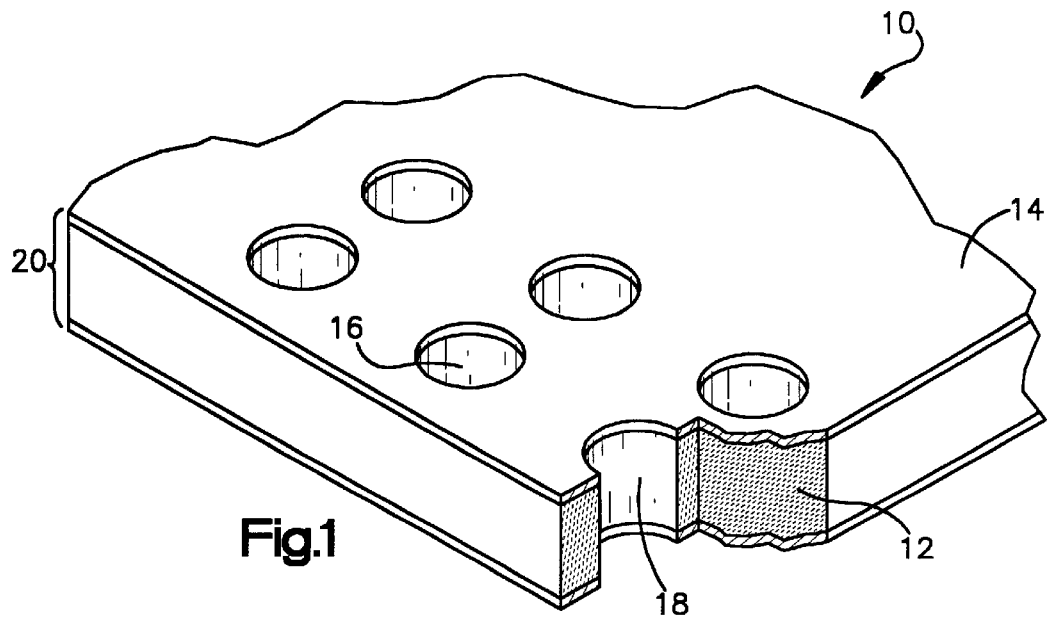
FIG. 1 is a perspective view of a portion of a substrate with conductive metal foil laminated on the surface of a dielectric material and holes formed therein with parts broken away.

The method of this invention employs a noble metal both as an etch mask for subtractive circuitization, and also as the seed layer for additive metalization finishing. Referring to the drawings and initially to FIG. 1, there is illustrated a laminate 10 comprised of a dielectric substrate 12 having an electrically-conductive foil 14, such as a copper foil, laminated thereon. A plurality of holes 16 having inner surfaces 18 are preferably drilled throughout the laminate 10 for making plated through holes for forming electrical connections between the front and back side of a board and to internal layers if present, the connections being well known in the art. Preferably, the electrically-conductive copper foil has a thickness of about 0.1 mil to about 1 mil, more preferably about 0.1 mil to about 0.5 mil and most preferably about 0.15 mil to about 0.25 mil.

Suitable substrates include but are not limited to ceramics, glass-filled ceramics, glasses and polymers. Exemplary polymeric materials useful to practice the present invention are polyimides, polyamides, polyamide-imides, polyolfins, such as polyethylene, polypropylene, polysulfones, polycarbonates, polyethylene, terephthalates, polyacrylates, polyacrylonitriles, polystyrene, polyesters, polysiloxanes, nitrile, ABS polymers, flouropolymers, thermosetting polymers.

In one embodiment a seed activator (not shown) is applied to the surface of conductive foil 14 and surface 18 of holes 16 via wet processing in a well-known manner. The seed activator catalytically activates surfaces 14 and 18 for copper circuitization via electroless deposition. Materials suitable as activators are palladium, nickel, silver, gold, platinum, rubidium, iridium, rhenium, rhodium, ruthenium, osmium, cobalt and copper and combinations thereof. Palladium is particularly effective as an activator and hence is preferred. Most preferably, palladium is present in a colloidal solution. The seed activator, preferably palladium, is deposited onto first conductive surface 14 and on inner surfaces 18 of the holes 16.

Next a coating of a photo-imageable material such as a photoresist is applied having a predetermined thickness which depends upon the thickness of circuitry required. Preferably, the overall thickness of the coating is approximately equal to the total thickness of the circuitry and the etch mask layers which are subsequently deposited on the laminate 10. The photoresist coating has a thickness ranging from about 0.2 mil to about 2.5 mils, preferably about 0.4 mil to about 1.5 mils and most preferably, about 0.6 to about 1.2 mils. The photoresist can be either positive acting or negative acting, and any one of a variety of commercially-available solvent, aqueous or semi-aqueous type photoresists may be utilized. An example of a photoresist suitable for use with the present invention is Riston T168 from Dupont de Nemours & Company. The photoresist coating is exposed to actionic radiation in the desired pattern and chemically developed.

Figure 2:
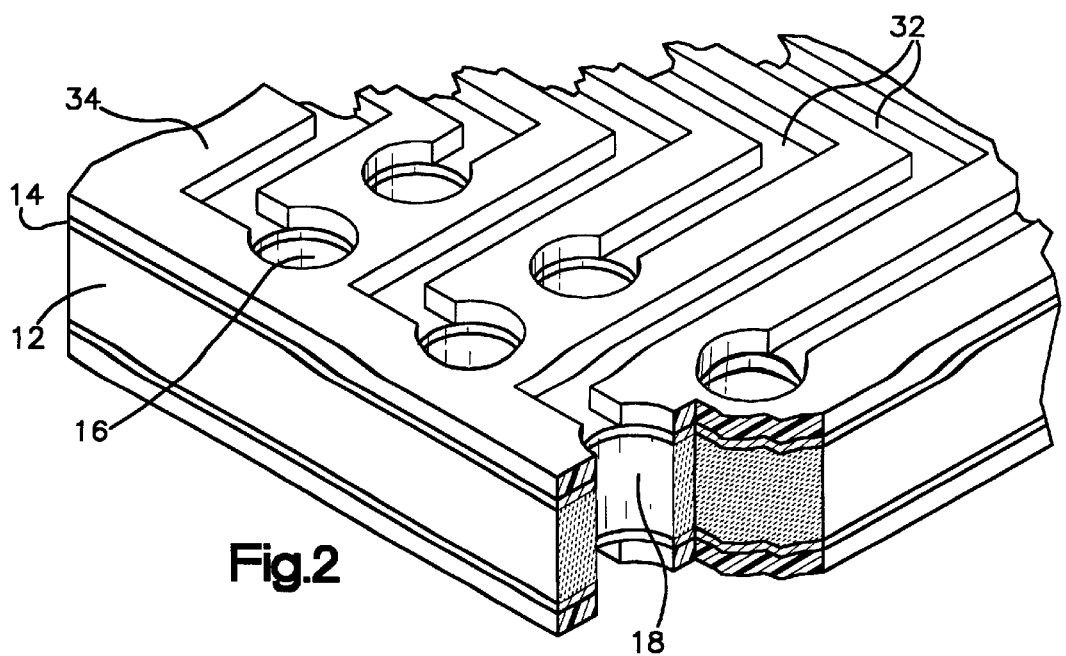
FIG. 2 is a perspective view of the composite of FIG. 1 subsequent to the application, exposure and development of a photoresist layer to produce a photo-imaged and developed pattern.

Any one of a variety of commercially-available developers may be utilized to develop the photoresist. An example of a developer suitable for use with a solvent-type photoresist is patented propylene carbonate solution, U.S. Pat. No. 5,268,260 commonly assigned herewith and incorporated herein by reference. The photoresist developer of this type is applied at about 23° C. to about 40° C. for between about 6 to 12 minutes. FIG. 2 shows the circuitization pattern 32 with portions of the photoresist removed thereby revealing portions of the layer of copper foil 14 uncovered as well as the holes 16.

Figure 3:
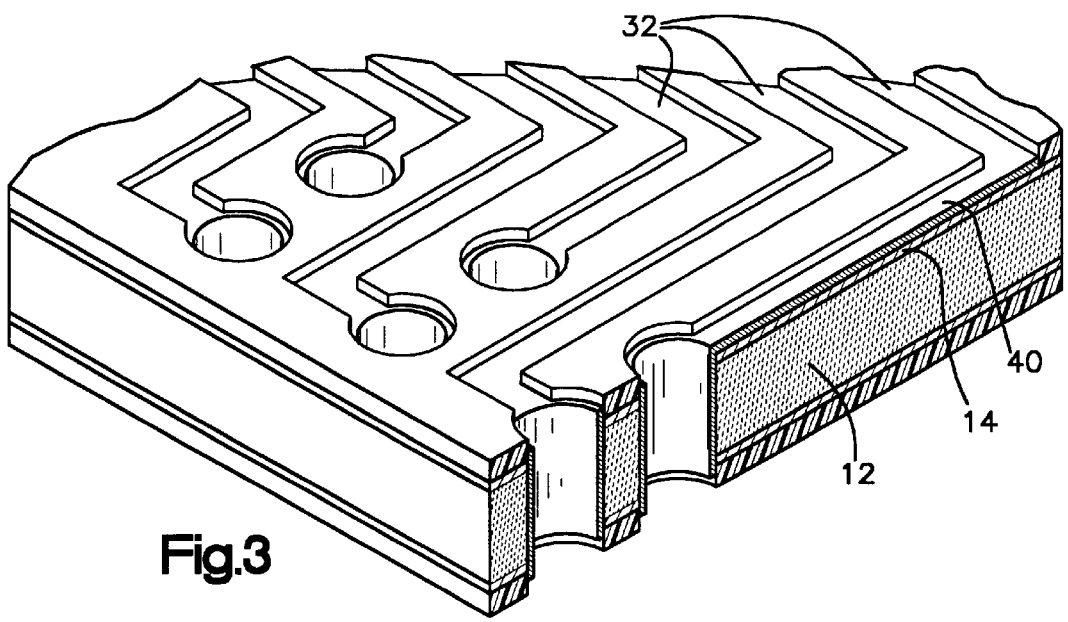
FIG. 3 is a perspective view showing a second conductive layer of metal on the inner surfaces of the holes and on top of the portion of metal foil which is not covered by photoresist.

Next, a second electrically-conductive layer for forming the circuitry is deposited by electroless plating. As can be seen in FIG. 3 the portions of the copper foil 14 not covered by photoresist coating 34, and the surfaces 18 of holes 16 are plated with a layer of conductive metal, such as copper 40. This second conductive layer 40 is plated to a thickness of about 0.02 mil to about 2.5 mils, preferably about 0.6 mil to about 1.2 mils and most preferably about 0.7 mil to about 1.1 mils thickness onto metal foil 14 in a well known manner.

Figure 4:
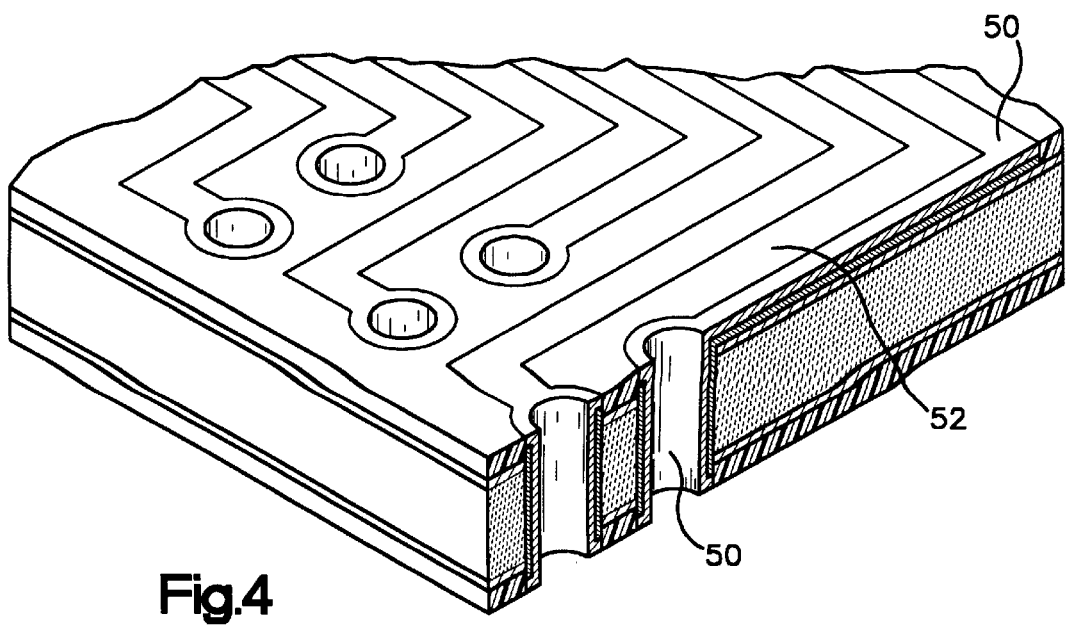
FIG. 4 is a perspective view subsequent to the deposition of a layer of noble metal on top of the second conductive layer of metal, both layers being on the areas of the printed circuit board not covered by the photoresist layer.

Next, a noble metal layer is deposited, preferably via electroless deposition, onto second layer of conductive metal 40. This noble metal layer 50 is the etch mask. Suitable noble metals for use as the etch mask include palladium, platinum, gold, silver, rhodium, iridium, rhenium, ruthenium and osmium and combinations thereof. Preferably, noble metal layer 50 comprises palladium and is electrolessly plated onto second conductive layer 40. The noble metal is deposited up to approximately the top surface of the photoresist 52 as shown in FIG. 4 to a thickness of at least about 0.01 mil, preferably at least about 0.015 mil to about 3 mils and most preferably about 0.02 mil to about 0.04 mil. Details of a suitable electroless plating bath are well known and are described in U.S. Pat. No. 4,525,390 and is hereby incorporated by reference herein.

After the noble metal layer has been deposited, the remaining photoresist coating is stripped away, thereby exposing the underlying copper foil in the areas surrounding the circuitry. A suitable stripping solution is a patented propylene carbonate solution described in U.S. Pat. No. 5,268,260, commonly assigned herewith. For photoresist stripping, the propylene carbonate is applied at elevated temperatures between about 50° C. to about 100° C. for about 5 minutes to about 30 minutes.

The circuit board is then subjected to the etching process to remove the copper foil from the substrate in the areas not protected by the noble metal etch mask. A suitable etching solution is cupric chloride which can be made by mixing bulk copper with hydrochloric acid. A cupric chloride etching solution having 1.5 to 3 Normality is preferably applied at a temperature of between about 40° C. to 55° C. for between about 30 seconds to 3 minutes, the time being dependent upon the thickness of the copper foil 14. Alternatively, an ammoniacal solution may be applied in the same manner. Examples of other acids suitable for use in etching copper foil 14 and exposing dielectric substrate 12 include: dilute and concentrated HX where X comprises fluorine, chlorine, bromine or iodine; acetic acid; non-oxidizing acids in the presence of suitable complexing or reducing agents; and cathodic treatment in an acid or alkaline solution.

Figure 5:
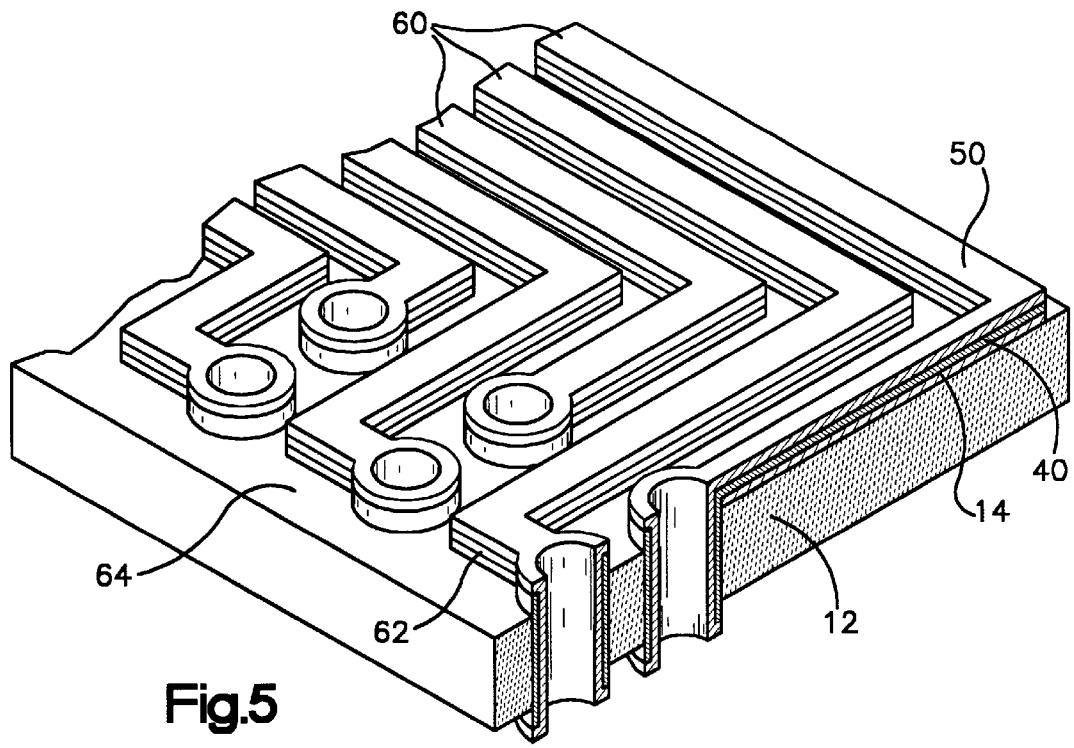
FIG. 5 is a perspective view of the composite with a layer of photoresist removed and the revealed metal foil etched away thereby exposing the substrate with the fine-line circuitry pattern.

Upon etching, surface areas 64 of the dielectric 12 are exposed as shown in FIG. 5. The finished fine-line circuitry 60 comprises noble metal etch mask/seed layer 50, first conductive layer of metal foil 14, and second conductive layer 40.

Figure 6:
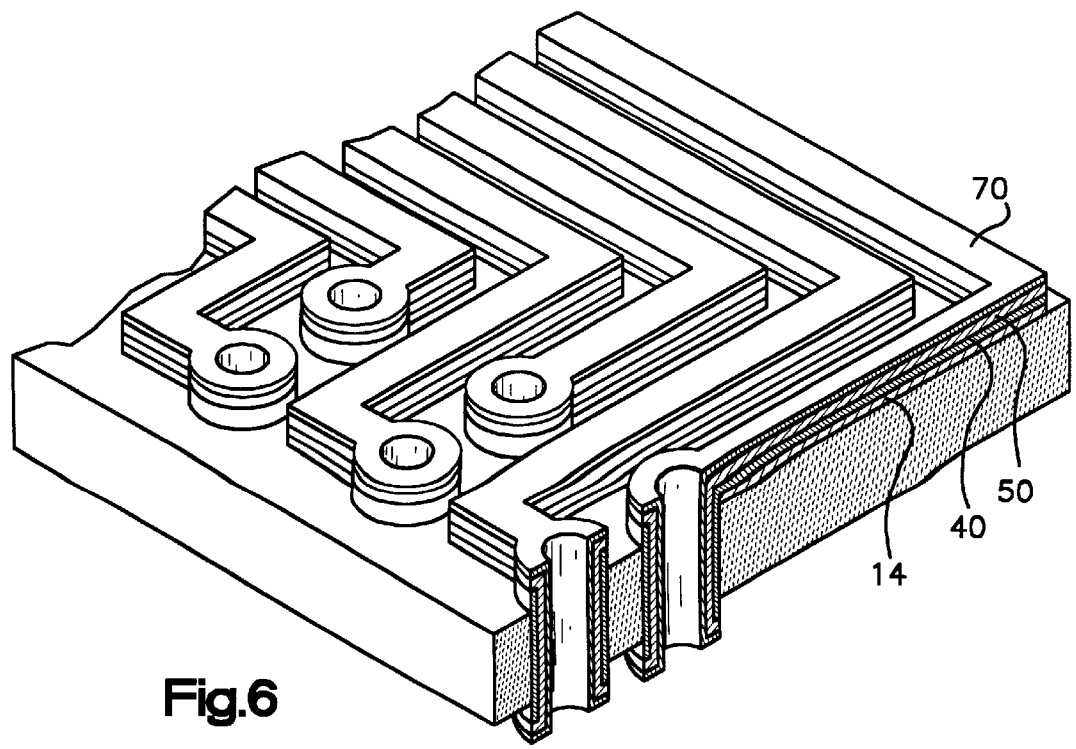
FIG. 6 is a perspective view of the printed wiring board subsequent to the deposition of a finishing layer of metal.

The noble metal layer 50 remains catalytically active as a seed layer and the invention contemplates the deposition of subsequent layers of metal, conductive finishing layers, comprising any one of a variety of conductive metals such as nickel, cobalt, silver or gold or combinations thereof on the circuitry. FIG. 6 shows an additional layer of metal 70, applied as secondary finishing.

In another embodiment of this invention, the second conductive layer or layers for forming circuitry may be deposited by the electrolytic plating method. Once electrically-conductive foil 14 of FIG. 1 has been laminated onto dielectric 12, the holes are drilled and metallized by one of a variety of methods. These methods include electroless deposition, described previously, or a host of direct metallization methods described in U.S. Pat. Nos. 5,376,248 and 5,415,762 and both are hereby incorporated by reference herein. Next, the photoresist coating is applied, exposed and developed to produce a circuit board as shown in FIG. 2. A second conductive metal 40, preferably copper, is electrolytically plated or electrolessly plated to the exposed pattern as shown in FIG. 3. First conductive layer 14 provides the pathway for charge, allowing plating to occur. FIG. 3 shows the second conductive layer 40 electrolytically plated along the pattern of circuitization 32. Noble metal layer 50 of FIG. 4 is deposited as discussed previously, via electrolytic or electroless deposition, to a thickness of at least about 0.01 mil, preferably about 0.015 mil to about 3 mils, and most preferably about 0.02 mil to about 0.04 mil prior to the etch process. The semi-additive circuitization process described herein employs noble metal, preferably palladium, as the etch mask for subtractive etching and as the seed layer for secondary finishing. The remaining photoresist coating is then stripped away and the remaining copper is etched away to reveal the substrate in the areas surrounding the circuitry as discussed previously. The noble metal remains catalytically active as a seed layer for subsequent deposition of conductive metals that are useful for bonding other components to the circuit board.

Although the invention has been shown and described with respect to certain embodiments, alternate equivalent modifications are possible. The present invention includes all such equivalent alterations and modifications, and is limited only by the scope of the following claims.

What is claimed is:

1. A process for producing a printed wiring board comprising the steps of:
    (a) applying a first electrically-conductive layer to a surface of a dielectric substrate;
    (b) covering said first electrically conductive layer with a coating and exposing and developing said coating to reveal selected areas of said first conductive layer;
    (c) depositing a second electrically-conductive layer on said selected areas of said first conductive layer;
    (d) depositing a metal layer consisting essentially of a catalytically active noble metal or combination of noble metals on said second electrically conductive layer;
    (e) removing said coating; and
    (f) selectively etching said first electrically conductive layer surrounding said selected areas to expose said substrate surface and allow said selected areas of said first electrically conductive layer to remain on said substrate.

2. The process of claim 1 wherein said noble metal is selected from the group consisting of gold, silver, platinum, palladium, iridium, rhenium, ruthenium, osmium and combinations thereof.

3. The process of claim 1 wherein said noble metal layer is palladium.

4. The process of claim 3 wherein said noble metal layer is at least about 0.01 mil thick.

5. The process of claim 1 wherein said first electrically-conductive layer comprises copper.

6. The process of claim 5 wherein said first copper layer is about 0.1 mil to about 1 mil thick.

7. The process of claim 1 wherein the coating is a photoresist.

8. The process of claim 7 wherein said coating is about 0.2 mil to about 2.5 mils thick.

9. The process of claim 1 wherein said second electrically conductive layer comprises copper.

10. The process of claim 9 wherein said second electrically conductive layer is about 0.02 mil to about 2.5 mils thick.

11. The process of claim 1 wherein said second electrically conductive layer and said noble metal are deposited by electroless plating.

12. The process of claim 1 wherein said second electrically conductive layer and said noble metal layer are deposited by electrolytic plating.

13. The process of claim 1 further comprising electrolessly plating a third electrically conductive layer on said noble metal layer.

14. The process of claim 13 wherein said third electrically conductive layer consists essentially of a metal selected from the group consisting of nickel, cobalt, silver, gold and combinations thereof.

15. A process for producing a printed wiring board which comprises:
    (a) covering the surface of a dielectric substrate with a conductive foil;
    (b) drilling at least one hole, said hole defining an inner surface;
    (c) depositing a seed activator on said inner surface of said hole;
    (d) applying a photoresist onto said conductive foil and exposing and developing portions of said photoresist to reveal areas of said conductive foil;
    (e) depositing conductive plating on said exposed areas of conductive foil and on said inner surface of said hole;
    (f) depositing a metal consisting essentially of palladium on said conductive plating;
    (g) stripping said photoresist; and,
    (h) selectively etching said conductive foil to expose dielectric substrate in areas surrounding said palladium and to allow said selected areas of said conductive layer to remain on said substrate.

16. The process of claim 15 wherein said conductive plating and said palladium are deposited by electroless plating.

17. The process of claim 15 wherein said conductive plating and said palladium are deposited by electrolytic plating.

18. The process of claim 15 wherein said seed activator is deposited by immersion plating and consists essentially of a metal selected from the group consisting of palladium, nickel, silver, gold, platinum, rubidium, iridium, rhenium, rhodium, ruthenium, osmium, cobalt, copper and combinations thereof.

19. The process as in claim 15, wherein the process further comprises electrolessly depositing a conductive finishing layer onto said palladium.

20. The process as in claim 19 wherein said conductive finishing layer comprises a metal selected from the group consisting of nickel, cobalt, silver, gold and combinations thereof.

21. A printed wiring board comprising a dielectric substrate, at least one conductive layer covering said dielectric substrate, a metal layer consisting essentially of a catalytically active noble metal or combination of noble metals covering said conductive layer, and a conductive layer covering said metal layer, wherein said conductive layer covering said metal layer is at least about 0.015 mil thick.

22. The board as defined in claim 21 wherein said noble metal is selected from the group consisting of gold, silver, platinum, palladium, iridium, rhenium, ruthenium, osmium and combinations thereof.

23. The board of claim 22 wherein the noble metal layers consist essentially of palladium.

* * * * *